United States Patent
Kobayashi et al.

(10) Patent No.: US 10,763,819 B2
(45) Date of Patent: Sep. 1, 2020

(54) ELECTRONIC DEVICE

(71) Applicant: TAIYO YUDEN CO., LTD., Taito-ku, Tokyo (JP)

(72) Inventors: Keiichi Kobayashi, Takasaki (JP); Yukihiro Matsui, Takasaki (JP); Fumihisa Ito, Takasaki (JP); Shigeo Ishii, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 617 days.

(21) Appl. No.: 15/513,421

(22) PCT Filed: Oct. 5, 2015

(86) PCT No.: PCT/JP2015/078171
§ 371 (c)(1),
(2) Date: Mar. 22, 2017

(87) PCT Pub. No.: WO2016/056500
PCT Pub. Date: Apr. 14, 2016

(65) Prior Publication Data
US 2017/0331452 A1 Nov. 16, 2017

(30) Foreign Application Priority Data
Oct. 10, 2014 (JP) .................................. 2014-208934

(51) Int. Cl.
*H01L 41/053* (2006.01)
*H03H 9/10* (2006.01)
(Continued)

(52) U.S. Cl.
CPC ............. *H03H 9/10* (2013.01); *B06B 1/0644* (2013.01); *G06F 1/1626* (2013.01);
(Continued)

(58) Field of Classification Search
CPC ....... H03H 9/10; B06B 1/0644; G06F 1/1633; H01L 41/09; H04M 1/03; H04M 1/0266;
(Continued)

(56) References Cited

U.S. PATENT DOCUMENTS

2016/0337757 A1* 11/2016 Ozasa .................... H04M 1/035
2017/0013334 A1* 1/2017 Hidaka .................... H04M 1/03
2017/0311086 A1* 10/2017 Ishii ......................... H04R 7/04

FOREIGN PATENT DOCUMENTS

JP 2005175553 A 6/2005
JP 2005192119 A 7/2005
(Continued)

OTHER PUBLICATIONS

International Search Report (ISR) dated Nov. 10, 2015, issued for International application No. PCT/JP2015/078171.

*Primary Examiner* — Thomas M Dougherty
(74) *Attorney, Agent, or Firm* — Law Office of Katushiro Arai

(57) ABSTRACT

In an embodiments, an electronic device 1 has a panel 20 of roughly rectangular shape, a housing 10 that holds the panel 20, and a piezoelectric element 30 installed on the rear face side of the panel 20, wherein the panel 20 is bonded to the housing 10 with its edges supported on the housing 10, and it also has at least one side 21 not bonded to the housing 10 (non-bonded side). The electronic device is capable of causing an entire panel to vibrate in a stable manner.

9 Claims, 3 Drawing Sheets

(51) Int. Cl.

| | |
|---|---|
| *H04R 17/00* | (2006.01) |
| *H01L 41/09* | (2006.01) |
| *H04M 1/03* | (2006.01) |
| *B06B 1/06* | (2006.01) |
| *H04R 7/04* | (2006.01) |
| *G06F 3/01* | (2006.01) |
| *G06F 1/16* | (2006.01) |
| *H04R 1/02* | (2006.01) |
| *H04M 1/02* | (2006.01) |
| *H04R 7/20* | (2006.01) |

(52) U.S. Cl.
CPC .......... *G06F 1/1637* (2013.01); *G06F 1/1688* (2013.01); *G06F 3/016* (2013.01); *H01L 41/09* (2013.01); *H04M 1/03* (2013.01); *H04R 7/045* (2013.01); *H04R 17/00* (2013.01); *H04M 1/0266* (2013.01); *H04M 2250/22* (2013.01); *H04R 1/025* (2013.01); *H04R 7/20* (2013.01); *H04R 2499/11* (2013.01)

(58) Field of Classification Search
CPC ... H04M 2250/22; H04R 7/045; H04R 17/00; H04R 1/025; H04R 7/20; H04R 2499/11
USPC .................................................. 310/311–371
See application file for complete search history.

(56) References Cited

FOREIGN PATENT DOCUMENTS

| | | |
|---|---|---|
| JP | 5255142 B1 | 4/2013 |
| JP | 2013207796 A | 10/2013 |

* cited by examiner

[FIG. 1]
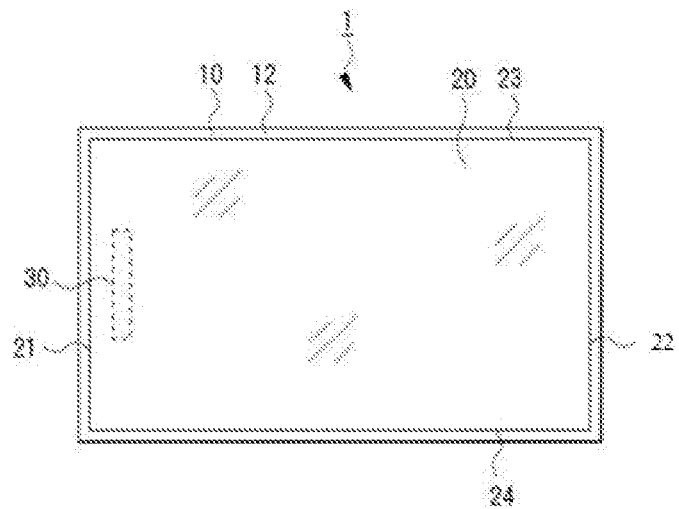
[FIG. 2]
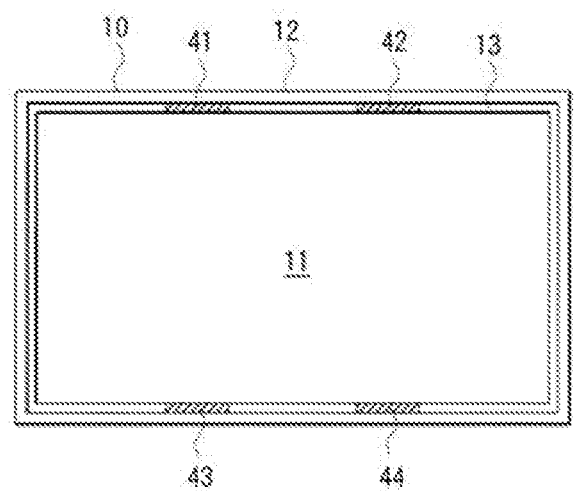
[FIG. 3]
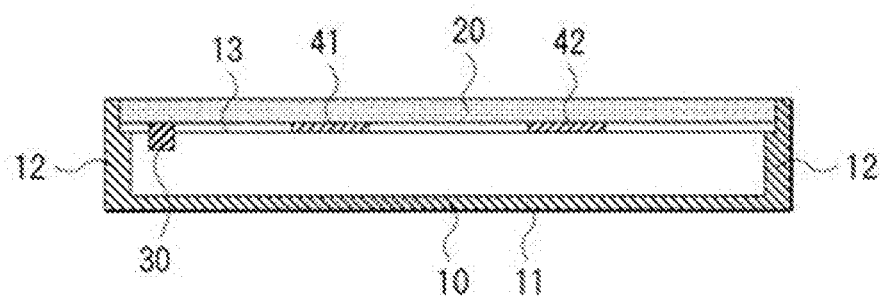

[FIG. 4]
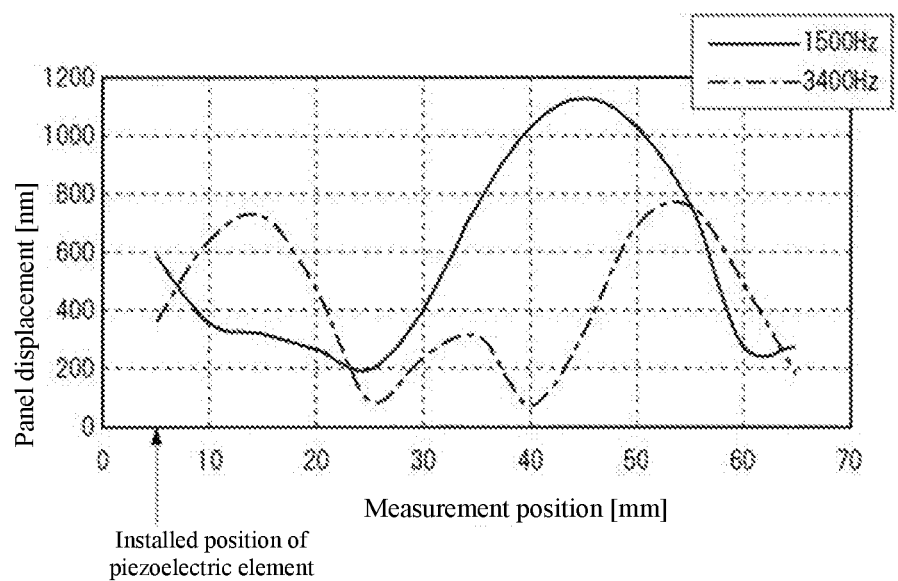
[FIG. 5]
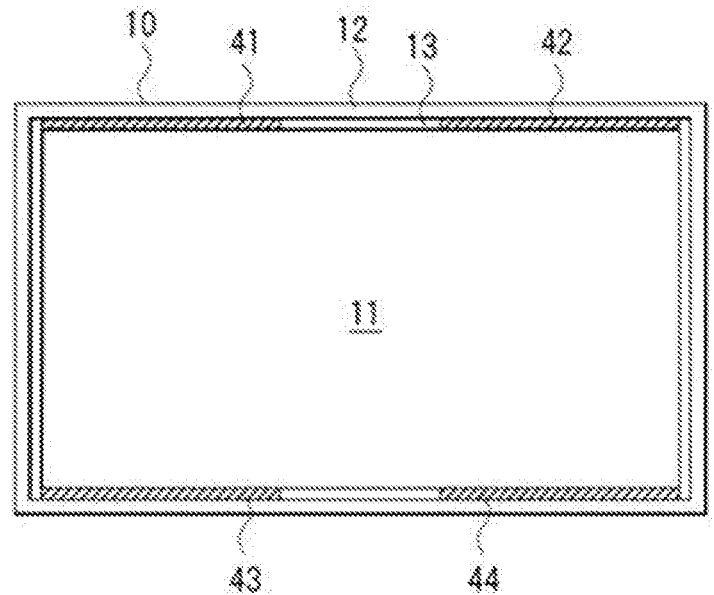

[FIG. 6]
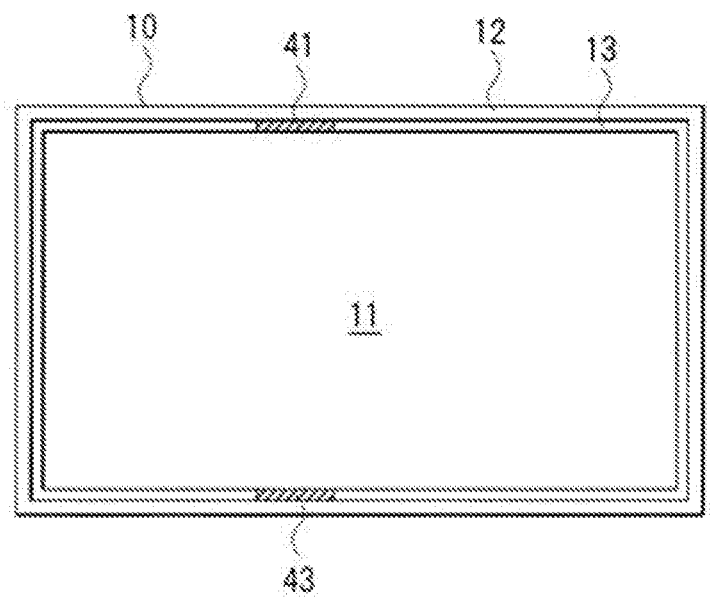

ELECTRONIC DEVICE

This application is the U.S. National Phase under 35 U.S.C. § 371 of International Application PCT/JP2015/078171, filed Oct. 5, 2015, which claims priority to Japanese Patent Application No. 2014-208934, filed Oct. 10, 2014. The International Application was published under PCT Article 21(2) in a language other than English.

TECHNICAL FIELD

The present invention relates to an electronic device with piezoelectric element.

BACKGROUND ART

Traditionally, multi-functional mobile communication terminals and other electronic devices commonly known as mobile phones and smartphones use piezoelectric elements called "piezoelectric speakers" as sounding elements for audio output. With traditional electronic devices, a piezoelectric element is placed inside a housing, and the housing has sound-passing holes to transmit sound to the outside by means of air conduction. On the other hand, technology has been proposed in recent years, whereby sound is transmitted by installing a piezoelectric element on the rear face side of a panel placed on the principle face of the housing, and then causing the panel to vibrate. Behind the proposal of such technology are various needs, such as a need to eliminate sound-passing holes so as to enhance waterproof property, a need to transmit sound not only by means of air conduction using air as the medium, but also by means of bone conduction, and a need to implement haptic technology that transmits vibration of a panel to the user tactually. Here, a "panel" means a touch panel that only has touch function and no display function, a touch panel that has both display function and touch function, or a protective panel designed to protect a liquid crystal display or other separate display.

One traditional electronic device adopting such technology is described in Patent Literature 1. The electronic device described in Patent Literature 1 has a housing, a panel of roughly rectangular shape whose edges are supported in the housing, and a piezoelectric element of roughly rectangular solid shape installed on the rear face side of the panel. The piezoelectric element is installed in such a way that its longitudinal direction intersects at right angles with the longitudinal direction of the panel, and in particular, it is positioned in such a way that the vibration amplitude of the panel becomes the highest at the installed position of the piezoelectric element. To be specific, the piezoelectric element is installed at a position near one end of the panel in the longitudinal direction.

BACKGROUND ART LITERATURE

Patent Literature

Patent Literature 1: Japanese Patent No. 5255142

SUMMARY OF THE INVENTION

Problems to be Solved by the Invention

With the electronic device described in Patent Literature 1 above, however, the piezoelectric element is installed near the end of the panel in such a way that the vibration amplitude of the panel becomes the highest at this installed position, which means that points of high sound pressures from air-conducted sound concentrate only near the end of the panel, and consequently sound pressures become low near the center in particular. This presents a problem in that, when the electronic device is used in a phone or other equipment used in direct contact with the ear, sound is difficult to hear unless the ear contacts the device at a precise position. Another problem is that, in the case of an audio speaker, etc., where the electronic device is used away from the ear, not in direct contact with the ear, sound quality becomes unstable. Furthermore, when the piezoelectric element is used as a form of haptic technology, the vibration amount varies significantly between the end and center of the panel, which presents the problem of the user not receiving stable tactile sensations depending on the position.

The present invention was developed in light of the aforementioned situation, and its object is to provide an electronic device capable of causing an entire panel to vibrate in a stable manner.

Means for Solving the Problems

To achieve the aforementioned object, the invention pertaining to the present application for patent is an electronic device having a panel of roughly rectangular shape, a housing that holds the panel, and a piezoelectric element installed on the rear face side of the panel, wherein such electronic device is characterized in that the panel is bonded to the housing with its edges supported on the housing, and it also has at least one side not bonded to the housing (non-bonded side).

According to the present invention, the vibration amplitude of the panel becomes the highest on the center side with reference to the installed position of the piezoelectric element, which allows the entire panel to vibrate in a stable manner.

One preferable embodiment of the present invention is characterized in that the piezoelectric element is installed near the non-bonded side of the panel. Another preferable embodiment of the present invention is characterized in that the piezoelectric element has a roughly rectangular solid shape and is installed to the panel in such a way that its longitudinal direction becomes parallel with the non-bonded side. Yet another preferable embodiment of the present invention is characterized in that the non-bonded side is a short side of the panel. Yet another preferable embodiment of the present invention is characterized in that, on a side bonded to the housing (bonded side), a non-bonded region which is not bonded to the housing is formed. Yet another preferable embodiment of the present invention is characterized in that a non-bonded region is formed at the center of a bonded side in the longitudinal direction. Yet another preferable embodiment of the present invention is characterized in that the non-bonded region is adjoining the non-bonded side.

Effects of the Invention

As described above, according to the present invention the vibration amplitude of the panel becomes the highest on the center side with reference to the installed position of the piezoelectric element, making the entire panel vibrate in a stable manner.

BRIEF DESCRIPTION OF THE DRAWINGS

FIG. 1 Schematic top view of the electronic device.
FIG. 2 Schematic top view of the electronic device with its panel removed.
FIG. 3 Section view of the electronic device.
FIG. 4 Graph of measured vibration amplitudes of the panel of the electronic device.
FIG. 5 Schematic top view of the electronic device pertaining to a different example, with its panel removed.
FIG. 6 Schematic top view of the electronic device pertaining to a different example, with its panel removed.

MODE FOR CARRYING OUT THE INVENTION

The electronic device pertaining to an embodiment of the present invention is explained by referring to the drawings. FIG. 1 is a schematic top view of the electronic device, FIG. 2 is a schematic top view of the electronic device with its panel removed, and FIG. 3 is a section view of the electronic device. In this embodiment, a multi-functional mobile communication terminal, or so-called smartphone, is explained as an example of electronic device.

As shown in FIGS. 1 to 3, the electronic device 1 has a housing 10 of thin box shape with an open top face, a panel 20 that closes the open top face of the housing 10, and a piezoelectric element 30 installed on the rear face side of the panel 20 or specifically the inner side of the housing 10.

The housing 10 has a thin box shape with an open top face, constituted by a bottom plate 11 and a frame 12 that surrounds the edges of the bottom plate 11. As shown in FIG. 2 and FIG. 3, a step 13 that holds the edges of the panel 20 is formed on the top inner side of the frame 12. The depth of the step 13 is roughly equal to the sum of the thickness of the panel 20 and the thickness of the adhesive member to be described later, so that the top face of the panel 20 becomes flush with the top face of the frame 12.

The panel 20 is a touch panel that has built-in touch function only to detect contact, a liquid crystal touch panel that has multiple built-in functions including touch function and display function such as a liquid crystal display, or a protective panel that does not have built-in touch function but only protects a liquid crystal display or other display placed in the housing 10. The panel has a rectangular sheet-shaped member as its primary component. The planar shape of the panel 20 is a rectangle identical to or slightly smaller than the interior surface shape of the frame 12. For the primary material of the panel 20, any of the various materials including glass and acrylic may be used. The front side of the panel 20 may be flat or curved.

The panel 20 has its edges bonded to the top face of the step 13 of the frame 12 by adhesive members. One characteristic point of the invention pertaining to the present application for patent is that, of the four sides of the panel 20, at least one side is not bonded to the step 13 along its edge, or in other words, is in a non-bonded state. In this embodiment, a pair of short sides 21, 22 of the panel 20 are non-bonded sides that are not bonded to the step 13. On the other hand, a pair of long sides 23, 24 of the panel 20 are bonded sides that are bonded to the step 13.

Here, the long sides 23, 24 of the panel 20 are not bonded to the step 13 along the entire edge; instead, they are bonded only in some regions and the other regions constitute non-bonded regions. To be specific, as shown in FIG. 2, the long sides 23, 24 each have two adhesive members 41, 42 or 43, 44 placed on them, which are constituted by adhesive, double-sided tape, etc. The adhesive members 41, 43 are placed at a specified distance away from the adhesive members 42, 44. In other words, on the long sides 23, 24, the gaps between the adhesive members 41, 43 and the adhesive members 42, 44 constitute non-bonded regions. These non-bonded regions are positioned at the centers of the long sides 23, 24, respectively. Additionally, on the long sides 23, 24, the regions between the adhesive members 41 to 44 and the short sides 21, 22 are also non-bonded regions, respectively. Accordingly, these non-bonded regions are adjoining the edges of the short sides 21, 22. It should be noted that, in FIGS. 2 and 3, the adhesive members 41 to 44 are hatched for the ease of viewing the drawings.

The piezoelectric element 30 has a roughly rectangular solid shape. For the piezoelectric element 30, any of the various types may be used including the bimorph type, unimorph type, and laminated type. In this embodiment, a laminated piezoelectric element was used. The piezoelectric element 30 is used to vibrate the panel 20 to transmit sound by means of air conduction or bone conduction, and also to transmit the vibration of the panel 20 tactually.

The piezoelectric element 30 is bonded with adhesive members (not illustrated) made of adhesive, double-sided tape, etc., on the rear face side of the panel 20. The piezoelectric element 30 has its longitudinal direction intersecting at right angles with the longitudinal direction of the panel 20, and its center in the longitudinal direction is positioned at the center of the panel 20 in the lateral direction. Additionally, under the present invention, the piezoelectric element 30 is positioned in such a way that one short side 21 or 22 becomes parallel with one longitudinal-side face of the piezoelectric element 30 near the short side 21 or 22 which is a non-bonded side. In this embodiment, it is positioned near one short side 21 of the panel 20 as shown in FIGS. 1 and 3. Preferably the distance between the side face of the piezoelectric element 30 and the short side 21 (=distance between a side of the panel and the side of the piezoelectric element closer to the side of the panel), is approx. 0.3 to 12 mm.

FIG. 4 shows a graph of measured vibration amplitudes of the panel 20 of the electronic device 1 pertaining to this embodiment. Here, a piezoelectric element 30 of 6 mm in width, 53 mm in length and 0.3 mm in thickness was used. The distance between the side face of the piezoelectric element 30 and the short side 21 of the panel 20 was set to 5 mm. Also, for the panel 20, reinforced glass of 64 mm in length, 133 mm in width and 0.55 mm in thickness was used. The width of the step 13 on the frame 12 of the panel 20 was set to 1 mm, and the widths of the adhesive members 41 to 44 were also made identical to the width of the step 13. Also, in FIG. 4, sine-wave signals of 20 $V_{p-p}$ and 1500 Hz, and sine-wave signals of 20 $V_{p-p}$ and 3400 Hz, were input to the piezoelectric element 30.

In the graph in FIG. 4, the vertical axis represents the vibration amplitude [nm], while the horizontal axis represents the measurement position. The measurement position is indicated by the distance [mm] from the short side 21 of the panel 20. Measurement was performed by a laser Doppler flow meter.

As shown in FIG. 4, it was found that, with the piezoelectric element 30 pertaining to this embodiment, the position at which the vibration amplitude of the panel 20 surface due to the vibration of the piezoelectric element 30 becomes the highest is not directly above the piezoelectric element 30, but it is displaced toward the center of the panel 20 in the longitudinal direction with reference to the installed position of the piezoelectric element 30. As a result, sound generates over a wide range without the sound generating points concentrating only in one area of the panel 20, which allows the entire panel to vibrate in a stable manner.

The foregoing explained an embodiment of the present invention in detail; however, the present invention is not limited to the foregoing. In the aforementioned embodiment, for example, the adhesive members 41, 42, 43, 44 are placed on the long sides 23, 24 in such a way that only some regions are bonded and the other regions constitute non-bonded regions; however, this is not the only mode. As shown in FIG. 5, for example, the adhesive members 41, 42, 43, 44 may be formed in a manner extending to the adjacent short sides 21, 22, respectively. In this case, only the gaps between the adhesive members 41, 43 and the adhesive members 42, 44, become non-bonded regions. Alternatively, as shown in FIG. 6, only the adhesive members 41, 43 may be provided on the long sides 23, 24. Or, three or more adhesive members may be provided on each of the long sides 23, 24. Or, the entire regions over the long sides 23, 24 may be bonded regions.

Additionally, in the aforementioned embodiment, the short side 22 not adjoined by the piezoelectric element 30, is not bonded to the step 13 of the frame 12; however, this short side 22 may also be bonded to the step 13. In this case, any of the various forms of adhesive members may be selected as desired, as is the case with the adhesive members on the long sides 23, 24. In other words, only some regions of the short side 22 may be bonded, or the entire region may be bonded.

While only one piezoelectric element 30 is installed to the panel 20 in the aforementioned embodiments, two or more may be installed. If two piezoelectric elements 30 are installed, for example, preferably one piezoelectric element 30 is installed at the position described above, while the other piezoelectric element 30 is installed at a position symmetrical to the aforementioned piezoelectric element 30 with respect to the center point of the panel 20.

Also, while the aforementioned embodiments explained a smartphone as an example of electronic device, the invention pertaining to the present application for patent may be applied to various electronic devices including tablet terminals, notebook PCs, mobile phones, watches, photo stands, and remote controllers and operating controls for various equipment.

DESCRIPTION OF THE SYMBOLS

1—Electronic device, 10—Housing, 11—Bottom plate, 12—Frame, 13—Step, 20—Panel, 21, 22—Short side, 23, 24—Long side, 30—Piezoelectric element, 41 to 44—Adhesive member.

What is claimed is:

1. An electronic device having a panel of roughly rectangular shape having a pair of long sides and a pair of short sides, a housing that holds the panel, and a piezoelectric element installed on a rear face side of the panel, wherein the panel is bonded to the housing with its edges supported on the housing, wherein:
    at least one of the pair of short sides is not bonded to the housing in its entirety (non-bonded side), and
    the pair of long sides are bonded to the housing (bonded side) along their edges wherein each bonded side has, along its edge, at least one non-bonded region which is not bonded to the housing, wherein the at least one non-bonded region is formed at a center of the bonded side in a longitudinal direction in a manner displacing a peak of vibration amplitude of the panel toward a center of the panel from an installed position of the piezoelectric element in the longitudinal direction when the piezoelectric element is driven.

2. An electronic device according to claim 1, characterized in that the piezoelectric element is installed near the non-bonded side of the panel.

3. An electronic device according to claim 1, characterized in that the piezoelectric element has a roughly rectangular solid shape and is installed to the panel in such a way that its longitudinal direction becomes parallel with the non-bonded side.

4. An electronic device according to claim 1, wherein on the bonded side, another non-bonded region which is adjoining the non-bonded side is formed.

5. An electronic device according to claim 1, characterized in that vibration amplitude of the panel due to a driving of the piezoelectric element becomes a highest on the center side of the panel in its longitudinal direction with reference to the installed position of the piezoelectric element.

6. An electronic device according to claim 2, characterized in that the piezoelectric element has a roughly rectangular solid shape and is installed to the panel in such a way that its longitudinal direction becomes parallel with the non-bonded side.

7. An electronic device according to claim 1, wherein the non-bonded region extends to a corner of the panel adjoining the non-bonded side.

8. An electronic device according to claim 2, characterized in that vibration amplitude of the panel due to a driving of the piezoelectric element becomes a highest on the center side of the panel in its longitudinal direction with reference to the installed position of the piezoelectric element.

9. An electronic device according to claim 3, characterized in that vibration amplitude of the panel due to a driving of the piezoelectric element becomes a highest on the center side of the panel in its longitudinal direction with reference to the installed position of the piezoelectric element.

* * * * *